United States Patent [19]

Eda

[11] Patent Number: 5,007,066
[45] Date of Patent: Apr. 9, 1991

[54] SEMICONDUCTOR LASER APPARATUS
[75] Inventor: Kazuo Eda, Nara, Japan
[73] Assignee: Matsushita Electric Industrial Co., Ltd., Osaka, Japan
[21] Appl. No.: 464,001
[22] Filed: Jan. 12, 1990
[30] Foreign Application Priority Data Jan. 12, 1989 [JP] Japan .................................... 1-5224

[51] Int. Cl.$^5$ ............................................... H01S 3/08
[52] U.S. Cl. ..................................... 372/108; 372/26; 372/99; 372/75; 372/69; 372/43
[58] Field of Search ..................... 372/108, 99, 75, 69, 372/26, 43

[56] References Cited

U.S. PATENT DOCUMENTS 4,913,547  4/1990  Moran ................................. 356/349

OTHER PUBLICATIONS

"Spectral Characteristics of External-Cavity Controlled Semiconductor Lasers", Fleming et al., IEEE Journal of Quantum Electronics, vol. QE-17, No. 1, Jan. 1981, pp. 44–59.
"Phase Conjugate Optics and Real-Time Holography", A. Yariv, IEEE Journal of Quantum Electronics, vol. QE-14, No. 9, Sep. 1978, pp. 650–660.
"CW Operation of Distributed-Feedback GaAS-GaAlAs Diode Lasers at Temperatures up to 300 K", Nakamura et al., Applied Physics Letters, vol. 27, No. 7, Oct. 1975, pp. 403–405.

Primary Examiner—Leon Scott, Jr.
Attorney, Agent, or Firm—Wenderoth, Lind & Ponack

[57] ABSTRACT

A semiconductor laser apparatus includes a semiconductor laser for emitting a light beam. The semiconductor laser has, as an external cavity, a quadruple light wave mixing optical phase conjugate element for inverting a spatial phase of an incident light beam. The apparatus further includes a pair of pump light sources which are arranged such that a superimposed portion of spectra of wavelengths of three light beams including two pump light beams emitted from the pair of pump light sources and entering into the optical phase conjugate element and another light beam emitted from the semiconductor laser is narrower than the spectral width of wavelengths of each of the three light beams. This enables the laser apparatus to generate an oscillating output wavelength of extremely narrow spectral width.

6 Claims, 3 Drawing Sheets

SEMICONDUCTOR LASER APPARATUS

BACKGROUND OF THE INVENTION

1. Field of the Invention

The present invention relates to a semiconductor laser apparatus which has extremely stable oscillation characteristics an extremely narrow spectral width at its oscillation output wavelength and is capable of electrically modulating the oscillating output wavelength at an extremely high speed. In particular, the semiconductor laser apparatus of the present invention is useful as a light source for an optical wavelength-division-multiplexing communication system and as a light source suited to coherent communication using coherent light, i.e. a light wave having a uniform spatial phase.

2. Description of the Prior Art

There are a variety of known prior art devices related to conventional semiconductor laser apparatuses either for narrowing the spectral width of oscillating output wavelength, or for stabilizing the oscillation characteristics, or for modulating the oscillating wavelength.

Typically, there is the "distributed feedback semiconductor laser" (DFB laser) which uses a waveguide diffraction grating for forming a light-resonant reflector. Another is the external cavity type semiconductor laser which generates light resonance by applying a diffraction grating and a semiconductor laser. The detail of the DFB laser was reported by M. Nakamura et al. in the technical paper "CW operation of the distributed feedback GaAs-GaAlAs diode lasers at temperature up to 300K", pages 403 through 405 of the Appl. Phys. Lett., 27, 1975. A typical example of the external cavity type semiconductor laser was described by M. Fleming et al. in the technical paper "Spectral Characteristics of External-Cavity Controlled Semiconductor Lasers", pages 44 through 59 of IEEE Journal of Quantum Electronics, QE-17, No. 1, 1981.

FIG. 6 illustrates a structure of a typical conventional DFB semiconductor laser. The reference numeral 601 shown in FIG. 6 designates a laser oscillator; element 602 is a light waveguide; element 603 is a waveguide type diffraction grating; element 604 is an open end surface functioning as a light-resonant reflector at the laser-beam emitting side, and numeral 605 designates a substrate. A light beam is generated by the laser oscillator 601 by the reunion of the electrically injected electrons and positive holes. The light beam enters into the waveguide type diffraction grating 603 via the light waveguide 602. The incident light beam then interacts the diffraction grating, and, only the light beam containing a wavelength having a specific relationship with the period of the diffraction grating is reflected therefrom. The reflected beam returns to the light waveguide, and then passes through the laser oscillator 601 before again being reflected by the conventional reflector 604 formed at the other end surface, thus eventually forming a light resonator together with the waveguide type diffraction grating 603 and the reflector 604. As a result, the resonant wavelength is fixed by the period of the diffraction grating 603, thus eventually generating a stable laser beam having a narrow spectral width of its oscillating output wavelength.

FIG. 7 illustrates a structure of a typical conventional external-cavity type semiconductor laser. The reference numeral 701 shown here designates a semiconductor laser; element 702 is a diffraction grating, and numeral 703 designates a reflector formed on the end surface at the laser-beam emitting side. A light beam generated by the semiconductor laser 701 resonates between the diffraction grating 702 and the reflector 703. However, the resonating wavelength is confined to the beam having a specific wavelength controlled by the diffraction grating, and as a result, a stable laser beam having a narrow spectral width of its oscillating output wavelength is generated.

Nevertheless, none of these conventional semiconductor laser apparatuses have achieved sufficient performance characteristics to be used as the light source of an optical wavelength-division-multiplexing communication system and for use in coherent optical communication. The DFB semiconductor laser uses the waveguide type diffraction grating. However, because of insufficient frequency selectivity, the spectral width of the oscillating output wavelength is not fully narrowed. On the other hand, any conventional external-cavity type semiconductor laser can use a diffraction grating having satisfactory wavelength selectivity. Since the diffraction gratings are apart from each other in space, these gratings are mechanically fixed by matching the optical axes. However, the optical axes cannot easily be matched, and due to varied temperature or displacement caused by mechanical oscillation, even the correctly matched light axes are adversely subjected to thermal expansion or contraction. As a result, actually, it is very difficult for manufacturers to produce stable diffraction gratings. The wider the spatial distance between the diffraction gratings, the narrower the spectral width of the oscillating output wavelength. Conversely, the wider the spatial distance, the easier it is for mechanical oscillation to occur. Consequently, conventional external cavity type semiconductor lasers cannot achieve fully satisfactory performance characteristics today.

A conventional light communication system can perform low-noise communication and wavelength multiplexing. Nevertheless, these conventional semiconductor laser apparatuses cannot perform these operations. This is because of the fact that conventional semiconductor laser apparatus fix the wavelength by applying the diffraction gratings. In order to vary the wavelength, the period and angle against the light of the diffraction grating must also be varied. However, conventional semiconductor laser apparatuses can hardly vary these parameters without applying a mechanical operation. Although the external cavity type semiconductor laser apparatus can vary the oscillating output wavelength by varying the angle of the diffraction grating, conventional systems availing themselves of the mechanical displacement cannot properly modulate frequencies ranging to $GH_z$ at a very high speed.

As is clear from the above description, that conventional semiconductor laser apparatuses cannot electrically and stably modulate frequencies having very narrow spectral width of their oscillating output wavelength at a very high speed in presence of variable surrounding environmental conditions.

SUMMARY OF THE INVENTION

An object of the present invention is to overcome those technical problems mentioned above by providing a novel semiconductor laser apparatus which is capable of securely generating an extremely narrow spectral width of its oscillating output wavelength and electrically modulating frequencies at an extremely high speed, and yet, capable of remaining stable against all the variable surrounding environmental conditions.

To achieve the above object, the present invention provides a novel semiconductor laser apparatus which comprises a semiconductor laser incorporating as an external cavity a quadruple lightwave mixing optical phase conjugate element having the function of inverting the spatial phase of an incident light, and a pair of pump light sources, in which a superimposed portion of the spectra of the wavelengths of three light beams including a pair of pump light beams entering into the quadruple light wave mixing optical phase conjugate element and a beam generated by the semiconductor laser in a case of absence of the external cavity becomes narrower than the spectral width of the wavelength of each of the three beams, and the wavelength of the beam generated by the semiconductor laser is narrowed by arranging the oscillating output wavelength by the external cavity type semiconductor laser to coincide with the wavelength of the superimposed portion of the spectra of the wavelength of the above three light beams and the wavelength of the generated laser beam is modulated by electrically modulating the frequencies of the pair of pump light beams.

By virtue of the structure mentioned above, the semiconductor laser apparatus of the present invention can electrically modulate frequencies at an extremely high speed while securely narrowing the spectral width of the oscillating output wavelength and remaining stable against variations of the surrounding environmental conditions.

DESCRIPTION OF THE PREFERRED EMBODIMENTS

Referring now more particularly to the accompanying drawings, the structure and functional performance of the semiconductor laser apparatus of the present invention is described below.

Figure 1:
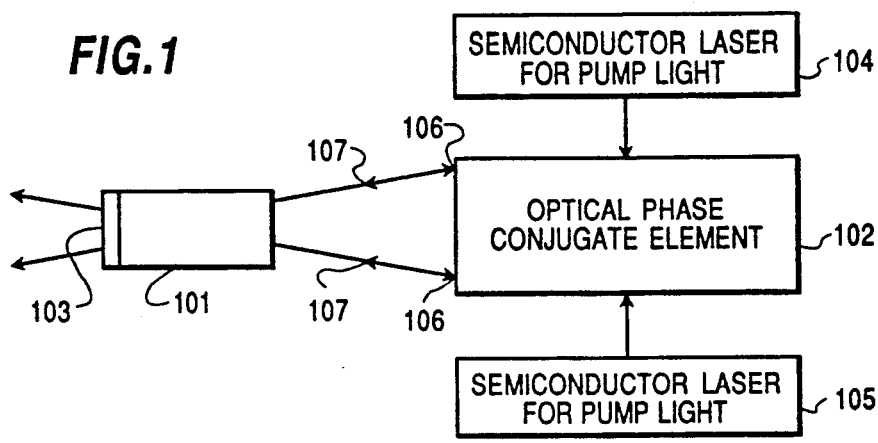
FIG. 1 illustrates a block diagram of a first embodiment of a semiconductor laser apparatus according to the present invention.

FIG. 1 illustrates a structure of a first embodiment of the semiconductor laser apparatus according to the present invention. The reference numeral 101 shown here designates a semiconductor laser oscillator; element 102 is a quadruple light wave mixing optical phase conjugate element, and numeral 103 designates a conventional reflector installed at the beam-emitting end surface of the semiconductor laser oscillator 101. The reference numerals 104 and 105 respectively designate semiconductor lasers feeding pump light beams to the quadruple light wave mixing optical phase conjugate element 102. These semiconductor lasers are optically arranged so that a pair of pump light beams can oppose to each other in the optical phase conjugate element 102. The reference numeral 106 designates an example of the passage of light beam emitted from the semiconductor laser oscillator 101, where the light beam enters as a probe beam into the optical phase conjugate element 102. The reference numeral 107 designates the passage of the phase conjugate light beam emitted from the optical phase conjugate element 102 as a result of the interaction of the pair of pump light beams and the probe beam.

Next, the functional operation of the optical phase conjugate is briefly explained below. Typically, the optical phase conjugate and its application are fully described by A. Yariv in his tenchnical paper "Phase Conjugate ----------------------------------------Optics and Real-Time Holography", page 650, IEEE Journal of Quantum Electronics, QE-14, No. 9, 1978.

Figure 2A:
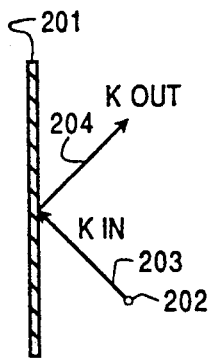
FIGS. 2(A) and 2(B) illustrate the functional performance of a light phase conjugate element used for the semiconductor laser apparatus according to the present invention.
Figure 2B:
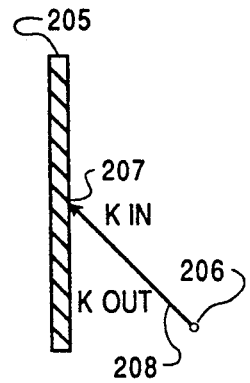

The optical phase conjugate element inverts the direction of a light wave propagating itself in an optional direction and full wave front of this light wave. FIGS. 2(A) and 2(B) designate the function of the optical phase conjugate element used to invert the full wave front of the light wave in comparison with the function of a conventional reflector. The reference numeral 201 shown in FIG. 2(A) designates a conventional reflector; element 202 is a light source; numeral 203 "Kin" designates the wave number vector of the incident light beam, and; numeral 204 "Kout" designates the wave number vector of the output beam reflected by the conventional reflector 201. The reference numeral 205 shown in FIG. 2(B) designates an optical phase conjugate element, 206 is a light source; numeral 207 "Kin" designates the wave number vector of the incident light beam, and numeral 208 "Kout" designates the wave number vector of the beam outputted from the optical phase conjugate element 205. FIG. 2(A) illustrates the state of light beam reflected by the conventional reflector 201. The light beam reflected by the conventional reflector 201 having the same reflection angle as the incident light angle is emitted at the side opposite from the incident light with respect to a plane perpendicular to the reflector's surface. FIG. 2(B) illustrates the performance of the optical phase conjugate element 205, in which such a wave is generated that inversely propagates through the path identical to that of the incident light beam. Concretely, the optical phase conjugate element generates a wave which has an inverted sign of the wave number vector. In other words, it generates a wave satisfying the relationship $Kin = -Kout$. This relationship can solely be generated in an extremely special case. To achieve this relationship, there is a known method called "quadruple light wave mixing". This method initially allows three light beams of the same frequency to enter into a special medium to generate the third-order nonlinear polarization in the medium, and allows the fourth light wave to be generated from the medium using the nonlinear polarization as the new light wave source. To implement this, of those three light waves which enter into the medium, suppose that two of them are termed as pump waves $Ep1$ and $Ep2$, and the other one is a probe wave $Epr$. The output phase conjugate wave is supposed to be $Epc$. The wave number vectors of these are supposed to be $Kp1$, $Kp2$, Kpr, and Kpc. When generating the phase conjugate wave, it is essential for the system to fully satisfy the phase-matching condition as per the equation shown below.

$$Kp1 + Kp2 = Kpr + Kpc$$

If the relationship Kp1+Kp2=0 were satisfied between the pump waves, then the relationship turns into Kpr+Kpc=0, and as a result, the relationship Kpr=−Kpc can constantly be obtained, i.e., the system can generate the phase conjugate wave. The relationship Kp1+Kp2=0 can be obtained by arranging two light sources of the same oscillation wavelength to oppose to each other. This relationship is also achieved by causing a light beam from a single light source to be reflected by a conventional reflector in the perfectly opposite direction. As a result, the optical phase conjugate element can be embodied by using a material having substantially a third-order nonlinear polarization. Such materials including barium titanate, bismuth silicate, bismuth germanate, and potassium niobate, and those group III-V compound semiconductor materials including gallium arsenide, aluminium gallium arsenide, indiumantimonide, and indiumlin, are suitable for forming the optical phase conjugate element mentioned above. Exciters which are constantly stable even in the presence of high temperatures can be formed by generating a multiple quantum well structure using a group III-V compound semiconductor. Since the presence of the exciters significantly promotes the third-order electric polarization, a more efficient optical phase conjugate element can be formed.

Figure 3A:
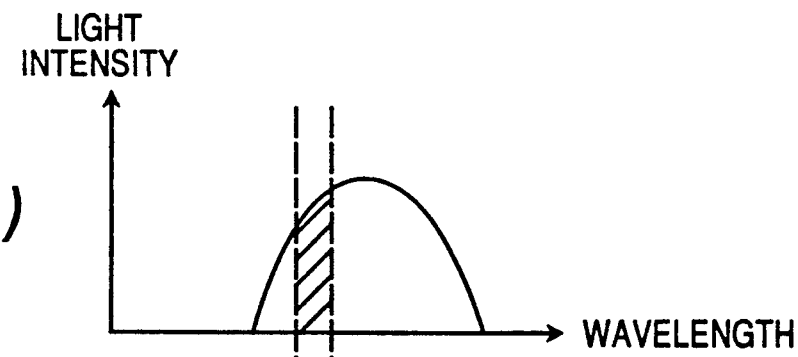
FIGS. 3(A) and 3(B) illustrate the spectra of the oscillating output wavelength of the semiconductor laser apparatus according to the present invention.
Figure 3B:
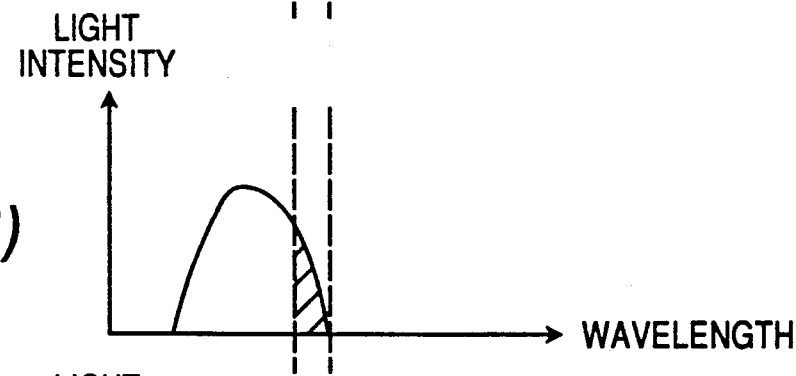
Figure 3C:
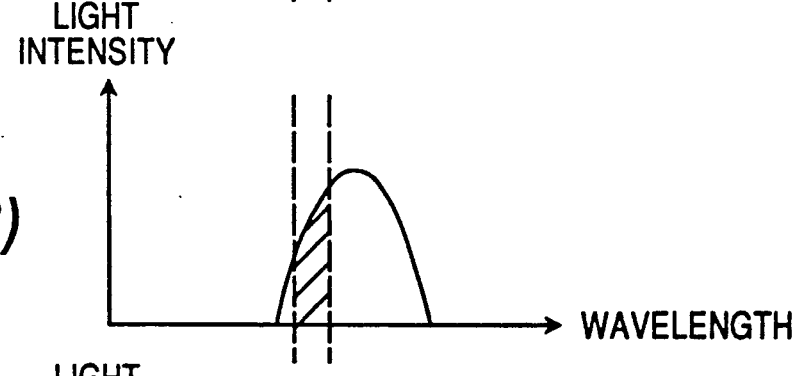
Figure 3D:
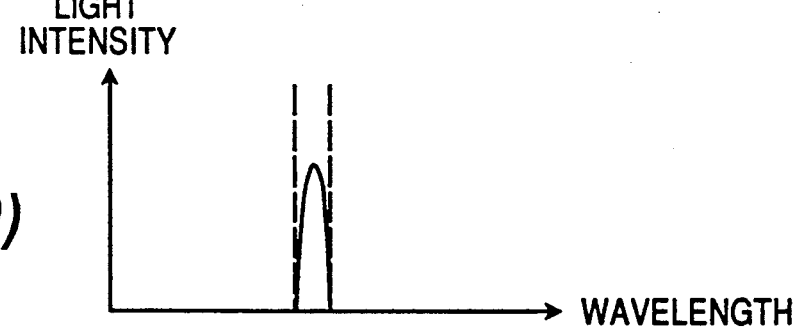
Figure 6:
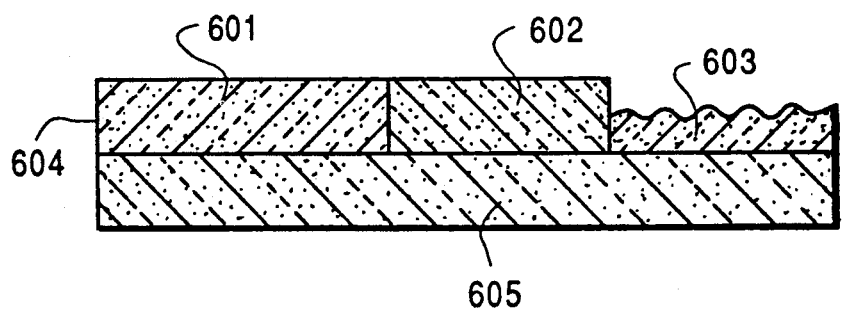
FIG. 6 illustrates a structure of a conventional semiconductor laser apparatus.
Figure 7:
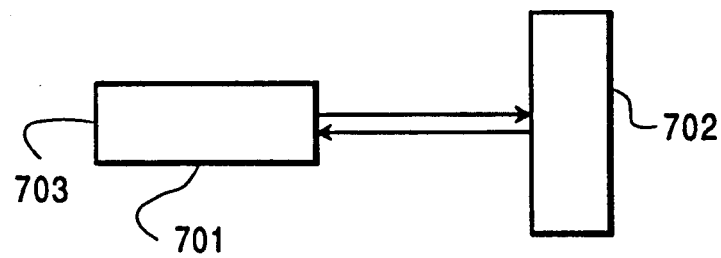
FIG. 7 illustrates a structure of another conventional semiconductor laser apparatus.

Next, the functional operation of the semiconductor laser apparatus based on the first embodiment and using the above optical phase conjugate element for one of the reflectors of the light resonator is described below. As shown in FIG. 1, the semiconductor lasers 104 and 105 respectively have oscillating output wavelength components of the same frequency. The wave number vectors of the light waves generated by the semiconductor lasers 104 and 105 are supposed to be Kp1 and Kp2. The relationship Kp1=−Kp2 can be obtained by arranging these laser beams to respectively propagate themselves in the directions perfectly opposite from each other. While this condition is present, when the light beam from the semiconductor laser 101 enters into the optical phase conjugate element, only the phase conjugate wave of the wavelength equal to that of the pump light is selectively emitted, which then returns to the semiconductor laser 101, and then, the returned phase conjugate wave is reflected by the conventional reflector 102, thus eventually generating optical resonance. Consequently, the resonant wavelength of the semiconductor laser 101 is fixed to the wavelength of the phase conjugate light, in other words, the wavelength of the pump light beam. FIGS. 3(A)-3(D) illustrate the widths or distribution, of the output wavelengths of the semiconductor lasers. More particularly, FIG. 3(A) illustrates the spectrum of the oscillating output wavelength of the first pump light. FIG. 3(B) illustrates the spectrum of the oscillating output wavelength of the second pump light. FIG. 3(C) illustrates the spectrum of the oscillating output wavelength of the semiconductor laser with the conventional reflector. Since the phase conjugate condition is merely satisfied by the portion where these spectra superimpose themselves, the wavelength of the phase conjugate light becomes the one shown in FIG. 3(D). Only the light beam having this wavelength returns to the semiconductor laser, and thus, it is possible to set the wavelength generated by this semiconductor laser to the wavelength of the superimposed portion by applying the optical phase conjugate element as the light resonant reflector of one side.

Figure 4:
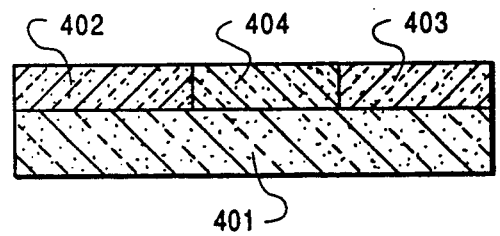
FIG. 4 illustrates a structure of another embodiment of a semiconductor laser apparatus according to the present invention.

FIG. 4 illustrates another embodiment of the present invention. The reference numeral 401 shown in FIG. 4 designates a substrate; element 402 is a semiconductor laser oscillator; element 403 is an optical phase conjugate element, and numeral 404 designates an optical waveguide which optically connects the semiconductor laser oscillator 402 to the optical phase conjugate element 403. The semiconductor laser oscillator 402, the optical phase conjugate element 403, and the optical waveguide 404 are integrated on the same substrate 401. The integrated structure of these components is formed by applying group III-V compound semiconductors like GaAs-AlGaAs, for example. Concretely, the semiconductor laser oscillator 402 has the same structure as that of the conventional double hetero-conjunction semiconductor laser. In other words, the semiconductor laser oscillator 402 has a layer having the aluminium density lower than that of GaAs layer or those of the upper and lower layers. By providing the optical waveguide 404 with the same structure as that of the above, light beams are confined inside of the above-mentioned layer before arriving at the optical phase conjugate element 403. The pair of pump beams opposite from each other are added to the optical phase conjugate element 403 from the outside. Since GaAs or AlGaAs has a sufficient third-order nonlinear effect, the phase conjugate light is generated, and then, it returns to the semiconductor laser oscillator 402. The returned light beam is reflected by the conventional reflector provided on the other surface of the semiconductor laser and then generates light resonance. As a result, the same functional operation as that performed by the first embodiment can also be performed by the second embodiment. In this way, by applying group III-V compound semiconductors, the laser oscillator 402 and the optical phase conjugate element 403 can integrally be formed on the identical substrate. By virtue of the structure mentioned above, the light beam generated by the semiconductor laser oscillator 402 directly enters into the optical phase conjugate element 403, and as a result, the system can achieve significant efficiency, thus eventually promoting the oscillation efficiency to fully satisfy the function of the semiconductor laser. Furthermore, since the semiconductor laser apparatus can be built very compactly and dispense with the process for assembling the semiconductor oscillator 402 and the optical phase conjugate element 403, manufacturers can very easily produce the semiconductor laser apparatus.

Figure 5:
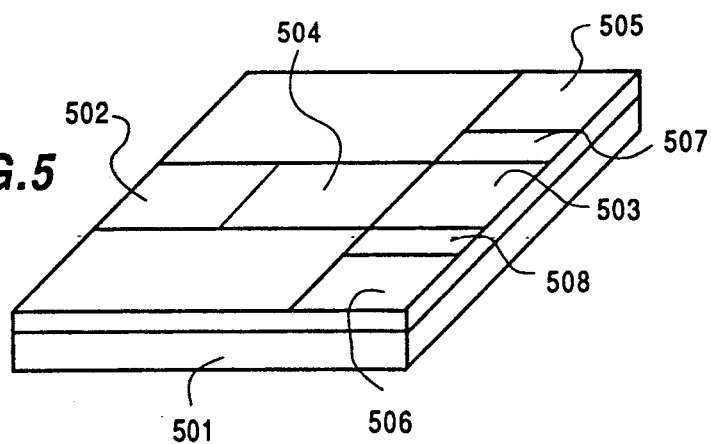
FIG. 5 illustrates a structure of a still further embodiment of a semiconductor laser apparatus according to the present invention.

FIG. 5 illustrates a still further embodiment of the present invention. The reference numeral 501 shown here designates a substrate; element 502 is a first semiconductor laser oscillator; element 503 is an optical phase conjugate element; element 504 is an optical waveguide which optically connects the first semiconductor laser oscillator 502 to the optical phase conjugate element 503. The reference numeral 505 designates a second semiconductor laser oscillator used as a first pump light source; element 506 is a third semiconductor laser oscillator used as a second pump light source, and elements 507 and 508 are respectively optical waveguides which optically connect the optical phase conjugate element 503 to the pump light sources 505 and 506. All of these components are integrated on the same substrate and compose an optical integrated circuit. The structure and the relationship of the first semiconductor laser oscillator 502 and the optical phase conjugate element 503 are identical to those corresponding components used for the second embodiment. The light beam generated by the second semiconductor laser 505 enters into the optical phase conjugate element 503 via the optical waveguide 507 and then becomes the first pump light. The light beam generated by the third semiconductor laser oscillator 506 passes through the optical waveguide 508 and then enters into the optical phase conjugate element 503 in which the light beam becomes the second pump light being opposite from the first pump light. This means that the pump light sources are also integrated on the same substrate in addition to the structure of the second embodiment. Like the second embodiment, the structure of the third embodiment can easily be built by applying group III–V compound semiconductors like GaAs, for example. By virtue of the above structure, in addition to those effects achieved by the first and second embodiments, a total of three semiconductor oscillators can be formed on the same substrate, which respectively generate wavelength spectra having widths which are almost identical to each other. As a result, there is no need for selecting the pump light semiconductor laser, and thus, the entire structure can be easily fabricated. Furthermore, owing to satisfactory light union efficiency of the pump light and the optical phase conjugate element, the total beam oscillating efficiency surpasses the second embodiment. In addition, since the pump light source is integrated on the same substrate, the total system can be built more compactly than that of the second embodiment. Since there is no need of matching the light axes, assembly work can be done more simply than that is needed for the second embodiment.

The semiconductor laser apparatus embodied by the present invention features the unique structure and operating principle described above, and based on these, the semiconductor laser apparatus provides those advantageous effects shown below.

First, in all the embodiments of the present invention, the semiconductor laser apparatus of the present invention can securely generate such a laser beam that has a spectral width narrower than the spectral width of each light source by narrowing the width of the spectra of the three-wave superimposed portion to a value lower than that of each light source. In principle, the width of the portion where respective spectra superimpose can be narrowed furthermore as required, and thus, the system can generate laser beams having an extremely narrow spectral width. This in turn allows users to use an inexpensive semiconductor laser having a relatively wide spectral width of its oscillating output wavelength.

Secondly, by virtue of the characteristic of the optical phase conjugate element in which only the space-wise phase of a light wave correctly inverts itself, the relative positional relationship between the semiconductor laser and the optical phase conjugate element cannot be varied by the influence of mechanical oscillation and thermal expansion, and yet, the above relationship constantly remains unaffected by even the slightest variations of the medium thus allowing the above relationship to remain quite stable against variable environmental conditions.

Thirdly, the superimposed portion can electrically be varied by allowing at least one of the pump light sources to electrically modulate frequencies. Availing of this, the oscillating output wavelength (i.e., the reciprocal number of the oscillating output frequency) of the semiconductor laser generating light resonance together with the optical phase conjugate element can be modulated. Any conventional semiconductor laser is known as a light source that can electrically modulate frequencies. When operating any conventional semiconductor laser, the oscillating output frequencies can easily be modulated up to several GHz by varying the incoming current. As a result, even when using any of those inexpensive semiconductor lasers having a relatively wide spectral width of its oscillating output wave, by virtue of the structure embodied by the present invention, it can generate a laser beam having an extremely narrow spectral width of its oscillating output wave and capable of stably performing electrical modulation of frequencies at a very high speed in all environmental conditions.

Next, referring to the second embodiment of the present invention, since the semiconductor laser oscillator and the optical phase conjugate element are optically combined with each other and integrally formed on the identical substrate, in addition to the advantageous effect of the first embodiment, the integrated system can be composed in a compact size, and the second embodiment promotes the beam emitting efficiency and allows the assembly work to easily be done.

Referring now to the third embodiment of the present invention, since the semiconductor laser oscillator, the optical phase conjugate element, and the pump light sources are optically combined together and integrated on the identical substrate, in addition to the advantageous effect of the first embodiment, the integrated system according to the third embodiment can be built more compactly than the integrated system of the second embodiment, and yet, the third embodiment can promote the light emitting efficiency furthermore and allows manufacturers to assemble the system more easily than the assembly of the system of the second embodiment.

When implementing the second and third embodiments, the efficiency for generating the phase conjugate light can be promoted by applying a multiplex quantum well structure of a group III–V compound semiconductor functioning as the optical phase conjugate element.

Although the third embodiment uses two of the semiconductor lasers functioning as the pump light sources, the third embodiment may also use a single pump light source by disposing a reflector which reflects light in the direction perfectly opposite from the emitting side of the first pump light of the optical phase conjugate element.

What is claimed is:
1. A semiconductor apparatus comprising:
a semiconductor laser emitting a light beam, said laser having, as an external cavity, a quadruple light wave mixing optical phase conjugate element inverting a spatial phase of an incident light beam from said semiconductor laser; and
a pair of semiconductor laser pump light sources each emitting a pump light beam;
wherein a superimposed portion of spectra of wavelengths from three light beams including said two pump light beams emitted from said pair of pump light sources and entering into said optical phase conjugate element and another light beam emitted from said semiconductor laser and entering into said optical phase conjugate element is narrower than the spectral width of wavelengths of each of said three light beams individually.

2. A semiconductor laser apparatus as set forth in claim 1, wherein at least one of said pump light sources has an oscillating output wavelength which is electrically controlled.

3. A semiconductor laser apparatus as set forth in claim 1, wherein a nonlinear electric-optical effect of a group III-V compound semiconductor forms said quadruple light wave mixing optical phase conjugate element.

4. A semiconductor laser apparatus as set forth in claim 1, wherein a nonlinear electric-optical effect of a group III-V compound semiconductor multiplex quantum well structure forms said quadruple wave mixing optical phase conjugate element.

5. A semiconductor laser apparatus comprising:
a semiconductor laser emitting a light beam, said laser having, as an external cavity, a quadruple light wave mixing optical phase conjugate element inverting a spatial phase of an incident light beam from said semiconductor laser; and
a pair of semiconductor laser pump light sources each emitting a pump light beam;
wherein a superimposed portion of spectra of wavelengths from three light beams including said two pump light beams emitted from said pair of pump light sources and entering into said optical phase conjugate element and another light beam emitted from said semiconductor laser and entering into said optical phase conjugate element is narrower than the spectral width of wavelengths of each of said three light beams individually, and wherein said optical phase conjugate element is formed of a group III-V compound semiconductor material and integrated on a single substrate together with an oscillator part of said semiconductor laser so that said optical phase conjugate element is optically coupled to said oscillator part as an optical resonating reflector at one side of said oscillator part.

6. A semiconductor laser apparatus comprising:
a semiconductor laser emitting a light beam, said laser having, as an external cavity, a quadruple wave mixing optical phase conjugate element inverting a spatial phase of an incident light beam from said semiconductor laser; and
a pair of additional semiconductor lasers forming a pair of pump light sources each emitting a light beam;
wherein a superimposed portion of spectra of wavelengths from three light beams including said two pump light beams emitted from said pair of pump light sources and entering into said optical phase conjugate element and another beam emitted from said semiconductor laser and entering into said optical phase conjugate element is narrower than the spectral width of wavelengths of each of said three light beams individually, and wherein said optical phase conjugate element is formed of a group III-V compound semiconductor material and optically coupled to said semiconductor lasers as an optical resonating reflector at one side of said semiconductor laser, and wherein said two pump light sources are optically coupled to said optical phase conjugate element and said semiconductor laser and integrated together on a single substrate.

* * * * *